United States Patent
Kubota et al.

(10) Patent No.: US 9,914,875 B2
(45) Date of Patent: Mar. 13, 2018

(54) OXYNITRIDE PHOSPHOR, MANUFACTURING METHOD THEREFOR, AND LIGHT EMITTING DEVICE PACKAGE USING SAME

(71) Applicant: LG ELECTRONICS INC., Seoul (KR)

(72) Inventors: Shunichi Kubota, Seoul (KR); Satoshi Tanaka, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/120,402

(22) PCT Filed: Jan. 29, 2015

(86) PCT No.: PCT/KR2015/000964
§ 371 (c)(1),
(2) Date: Aug. 19, 2016

(87) PCT Pub. No.: WO2015/126072
PCT Pub. Date: Aug. 27, 2015

(65) Prior Publication Data
US 2017/0073577 A1    Mar. 16, 2017

(30) Foreign Application Priority Data

Feb. 20, 2014   (KR) .................. 10-2014-0019703

(51) Int. Cl.
*H01L 33/62* (2010.01)
*C09K 11/77* (2006.01)
(Continued)

(52) U.S. Cl.
CPC ...... *C09K 11/7734* (2013.01); *C09K 11/0883* (2013.01); *C09K 11/7706* (2013.01);
(Continued)

(58) Field of Classification Search
CPC . H01L 2224/48091; H01L 2924/00014; H01L 2924/181; H01L 2924/00;
(Continued)

(56) References Cited

U.S. PATENT DOCUMENTS 8,986,574 B2 * 3/2015 Won .................. C09K 11/7731
252/301.4 F
2006/0170332 A1 * 8/2006 Tamaki ................ C09K 11/02
313/498

(Continued)

FOREIGN PATENT DOCUMENTS

JP      2013-249466      12/2013
KR      10-0993692       11/2010

(Continued)

OTHER PUBLICATIONS

Zhang, M. et al. "A tunable green alkaline-earth silicon-oxyitride solid solution $(C_{a1-x}Sr_x)Si_2O_2N_2:Eu^{2+}$ and it application in LED"; Applied Physics B, Laser and Optics; vol. 93, No. 4; On-line Oct. 11, 2008; pp. 829-835.

(Continued)

*Primary Examiner* — Jaehwan Oh
(74) *Attorney, Agent, or Firm* — Ked & Associates, LLP

(57) ABSTRACT

The present invention relates to a phosphor, and particularly to an oxynitride phosphor, a manufacturing method therefor, and a light emitting device package using same. The present invention may provide an oxynitride phosphor which is represented by chemical formula 1 below, and which has a monoclinic crystalline structure.

$(Sr,Ca)_{1-y}Si_2N_2O_2:Eu_y$     Chemical formula 1:

13 Claims, 5 Drawing Sheets

(51) Int. Cl.
C09K 11/08 (2006.01)
H01L 33/50 (2010.01)
H01L 33/56 (2010.01)

(52) U.S. Cl.
CPC ............ *H01L 33/504* (2013.01); *H01L 33/56* (2013.01); *H01L 33/62* (2013.01); *H01L 2224/48091* (2013.01); *H01L 2224/48247* (2013.01); *H01L 2224/48257* (2013.01); *H01L 2224/48465* (2013.01); *H01L 2224/49107* (2013.01); *H01L 2224/8592* (2013.01); *H01L 2924/181* (2013.01)

(58) Field of Classification Search
CPC . H01L 2224/48247; H01L 2924/00012; H01L 33/502; H01L 2224/8592; H01L 2924/12044; H01L 33/504; H01L 33/50; H01L 33/501
See application file for complete search history.

(56) References Cited

U.S. PATENT DOCUMENTS

| | | | | |
|---|---|---|---|---|
| 2009/0066230 A1* | 3/2009 | Hirosaki | ............ | C01B 21/0602 313/504 |
| 2012/0062105 A1* | 3/2012 | Li | ................... | C09K 11/0883 313/503 |
| 2012/0068591 A1* | 3/2012 | Kim | ................... | C09K 11/0883 313/484 |
| 2013/0127330 A1* | 5/2013 | Won | ................... | C09K 11/7731 313/498 |
| 2013/0181164 A1* | 7/2013 | Sohn | ................... | C09K 11/0883 252/301.4 F |
| 2013/0207538 A1* | 8/2013 | Hirosaki | ............ | C09K 11/0883 313/504 |
| 2014/0284649 A1* | 9/2014 | Baumgartner | ..... | C09K 11/7734 257/98 |
| 2015/0070875 A1* | 3/2015 | Hirosaki | ............ | C09K 11/7706 362/97.3 |
| 2015/0084083 A1* | 3/2015 | Hirosaki | ............ | C09K 11/7734 257/98 |
| 2015/0179899 A1* | 6/2015 | Hirosaki | ............... | H01L 33/502 257/88 |
| 2015/0275081 A1* | 10/2015 | Sohn | ................... | C09K 11/0883 252/301.4 F |
| 2016/0060518 A1* | 3/2016 | Hirosaki | ............... | H01L 33/502 257/98 |
| 2016/0096991 A1* | 4/2016 | Hirosaki | ............... | H01L 33/502 257/98 |
| 2016/0172549 A1* | 6/2016 | Srivastava | ............ | H01L 33/504 257/98 |
| 2017/0073577 A1* | 3/2017 | Kubota | ............... | C09K 11/0883 |

FOREIGN PATENT DOCUMENTS

| | | |
|---|---|---|
| KR | 10-2011-0085490 | 7/2011 |
| KR | 10-2012-0104018 | 9/2012 |

OTHER PUBLICATIONS

International Search Report and Written Opinion dated Mar. 27, 2015 issued in Application No. PCT/KR2015/000964 (with English translation).

* cited by examiner

Example 1

OXYNITRIDE PHOSPHOR, MANUFACTURING METHOD THEREFOR, AND LIGHT EMITTING DEVICE PACKAGE USING SAME

CROSS-REFERENCE TO RELATED PATENT APPLICATIONS

This application is a U.S. National Stage Application under 35 U.S.C. § 371 of PCT Application No. PCT/KR2015/000964, filed Jan. 29, 2015, which claims priority to Korean Patent Application No. 10-2014-0019703, filed Feb. 20, 2014, whose entire disclosures are hereby incorporated by reference.

TECHNICAL FIELD

The present invention relates to phosphor, in particular, to an oxy-nitride phosphor, a method for manufacturing the same and a light emitting device package using the same.

BACKGROUND ART

Light emitting diodes (LEDs) emitting white light are next-generation light emitting device candidates which can replace fluorescent lights as the most representative conventional lights.

Light emitting diodes have low power consumption as compared to conventional light sources and are environmentally friendly because they do not contain mercury, unlike fluorescent lights. In addition, light emitting diodes have advantages of long lifespan and high response speed as compared to conventional light sources.

Such an LED may be used in combination with a phosphor which absorbs light emitted from the LED and emits various colors of light. The phosphor generally emits white, green and red light.

Oxide-based phosphors which emit light based on rare earth elements have been known and some oxide-based phosphors are commercially available. However, unlike phosphors, which have been conventionally used for CCFLs for PDPs, CRTs and LCDs, phosphors for LEDs need to efficiently emit light, based on excitation from ultraviolet to blue light.

Many nitride phosphors or oxy-nitride phosphors which satisfy this requirement are present, but a research on these phosphors is not actively performed. Oxy-nitride phosphors of M-Al—Si—O—N and M-Si—O—N (M: alkali earth metal) are known. As reported in Patent Document 1 (Japanese Patent Laid-open Publication No. 4415547) and Patent Document 2 (Japanese Patent Laid-open Publication No. 4415548), M-Si—O—N includes two types of alkali earth metal elements, thereby obtaining phosphors having an orthorhombic crystal structure.

However, the oxy-nitride phosphors have lower brightness than currently commercially available oxide phosphors. Accordingly, oxy-nitride phosphors require improved brightness for commercialization.

DISCLOSURE

Technical Problem

An object of the present invention devised to solve the problem lies in an oxy-nitride phosphor with superior brightness, a method for manufacturing the same and a light emitting device package including the same.

Technical Solution

The object of the present invention can be achieved by providing an oxy-nitride phosphor represented by the following Formula 1 and having a monoclinic crystal structure.

$$(Sr,Ca)_{1-y}Si_2N_2O_2:Eu_y \qquad \text{<Formula 1>}$$

The crystal structure may have a unit cell volume of 1,400 Å³ or more.

The phosphor may have a peak emission wavelength of 530 nm to 580 nm.

A content y of the activator may be not less than 0.001 and not more than 0.15.

In another aspect of the present invention, provided herein is a method of producing an oxy-nitride phosphor including forming, using starting materials, an oxy-nitride phosphor represented by the following Formula 1 and having a monoclinic crystal structure:

$$(Sr,Ca)_{1-y}Si_2N_2O_2:Eu_y \qquad \text{<Formula 1>}$$

The starting materials may include at least one of carbonate of an alkali earth metal, silicon oxide, silicon nitride, europium oxide, Ca, Sr, Si and Eu, oxides thereof, and nitrides thereof.

At least one of $SrF_2$, $BaF$, $H_3BO_4$ and $NaCl$ may be used as a flux for formation of the phosphor.

The formation of the phosphor may be carried out by baking at a temperature of 1,400 to 1,700° C. under a reducing atmosphere or an inert atmosphere.

The phosphor may have a peak emission wavelength of 530 nm to 580 nm.

A content y of the activator may be not less than 0.001 and not more than 0.15.

The crystal structure may have a unit cell volume of 1,400 Å³ or more.

In another aspect of the present invention, provided herein is a light emitting device package including a first phosphor represented by Formula 1, or represented by Formula 1 and produced by the method, and a light emitting device for emitting excitation light to excite the first phosphor.

The light emitting device package may further include a second phosphor having a peak wavelength of the excitation light and an emission peak different from a peak wavelength of the first phosphor.

The light emitting device package may have an emission spectrum having one or more emission peaks in at least one of wavelength bands of 430 to 500 nm and 500 to 730 nm.

A light transmitting resin may be disposed on the light emitting device and the first phosphor may be present in the light transmitting resin.

Advantageous Effects

The present invention has an effect of providing an oxy-nitride phosphor having a new crystal structure and emitting light with high brightness.

The technical effects of the present invention are not limited to those described above and other effects not described herein will be clearly understood by those skilled in the art from the following description.

BEST MODE

Figure 1:
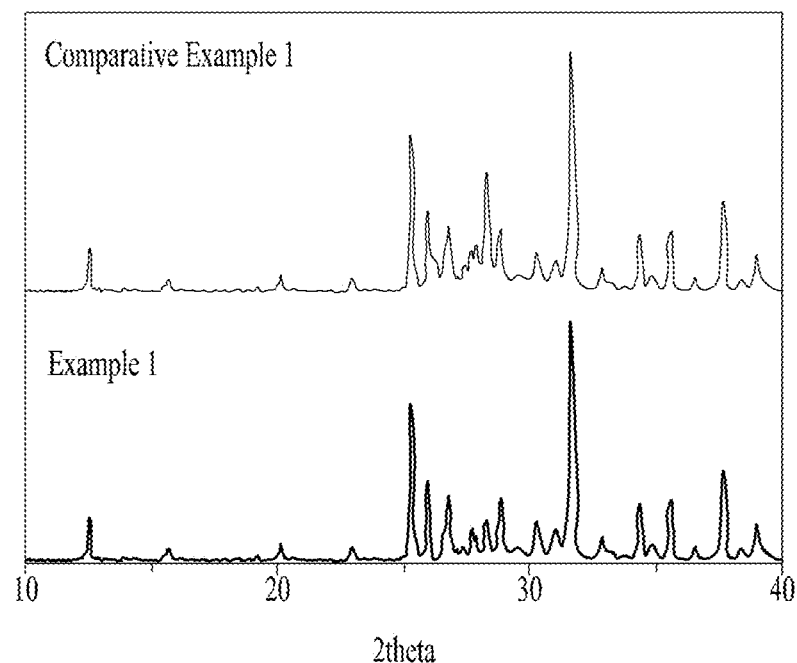
FIG. 1 is a spectrum of x-ray diffraction patterns of Example 1 and Comparative Example 1 according to the present invention.

Reference will now be made in detail to the preferred embodiments of the present invention, examples of which are illustrated in the accompanying drawings.

However, the present invention allows various modifications and variations and specific embodiments thereof are exemplified with reference to the drawings and will be described in detail. The present invention should not be construed as limited to the embodiments set forth herein and includes modifications, equivalents and substitutions compliant with the spirit or scope of the present invention defined by the appended claims.

It will be understood that when an element such as a layer, area or substrate is referred to as being "on" another element, it may be directly on the element, or one or more intervening elements may also be present therebetween.

In addition, it will be understood that although terms such as "first" and "second" may be used herein to describe elements, components, areas, layers and/or regions, the elements, components, areas, layers and/or regions should not be limited by these terms.

In the present invention, regarding an oxy-nitride phosphor represented by M-Si—O—N:Eu (wherein M is an alkali earth metal), phosphors in which compositions of Sr and Ca used as components of M are changed are synthesized under different conditions and luminescent characteristics thereof are evaluated.

As a result, according to the present invention, an oxy-nitride phosphor which has a new crystal structure, which was not reported by conventional patent documents, and exhibits superior brightness can be synthesized.

The crystal structure of the oxy-nitride phosphor according to the present invention is different from crystal structure (clinic system) of the conventional phosphor represented by $SrSi_2N_2O_2$:Eu and is a monoclinic system (b), which is the same crystal structure as the conventional phosphor (monoclinic system (a)) represented by $CaSi_2N_2O_2$:Eu, but has considerably different lattice constant from the conventional phosphor.

The difference in crystal structure can be easily confirmed by comparison of X-ray diffraction patterns and it can be easily seen that the crystal structure of the oxy-nitride phosphor according to the present invention is different from the crystal structure of Comparative phosphor. A TEM electron diffraction image supporting x-ray diffraction pattern data is shown in the annexed drawing.

The present invention provides an oxy-nitride phosphor which is represented by the following Formula 1 and has a monoclinic crystal structure.

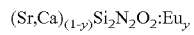

$(Sr,Ca)_{(1-y)}Si_2N_2O_2$:Eu$_y$  [Formula 1]

In the phosphor represented by Formula 1 above, a unit cell volume of the crystal structure of the phosphor may be 1,400 Å$^3$ or higher.

In addition, the oxy-nitride phosphor may have a peak emission wavelength of 530 nm to 580 nm.

In this case, in Formula 1, the content y of an activator may be not less than 0.001 and not higher than 0.15.

Hereinafter, a method of synthesizing the oxy-nitride phosphor according to the present invention will be described. However, the present invention is not limited thereto.

Carbonate of an alkali earth metal M in Formula 1, $SiO_2$, $Si_3N_4$ and $Eu_2O_3$ are mixed in a predetermined ratio until the mixture becomes homogeneous. Raw materials for synthesis of the phosphor may include metals such as Ca, Sr, Si and Eu, oxides, nitrides and various salts.

In addition, a part or entirety of these raw materials may be used as a liquid such as an aqueous solution.

Meanwhile, substances acting as flux such as $SrF_2$, BaF, $H_3BO_4$ and NaCl may be simultaneously mixed during synthesis.

Hereinafter, the oxy-nitride phosphor has enough high properties to endure approximate (or rough) contents of raw materials shown in examples. In addition, the weights of respective components can be changed and the composition of desired phosphor can be changed.

The mixture described above is fed into a boron nitride crucible and a phosphor is baked at a temperature of 1,400 to 1,700° C. under a reducing or inert atmosphere. In addition, an alumina crucible may be used instead of the boron nitride crucible.

In synthesis of the phosphor, a baking temperature is more preferably 1,450 to 1,600° C.

The reducing atmosphere may be a nitrogen-hydrogen atmosphere, an ammonia atmosphere, or a nitrogen-ammonia atmosphere and the inert atmosphere may be a nitrogen atmosphere, an argon atmosphere or the like.

In addition, the phosphor can be obtained by mixing a part of the raw materials described above, baking the mixture, adding the remaining raw materials to the mixture and then baking the resulting mixture.

As such, the baked substance thus obtained is cleaned, for example, with distilled water having pH 8 or less or purified water free of impurities.

In the respective examples described below, a ratio of calcium, strontium and europium (Ca:Sr:Eu) is described in the corresponding example.

Example 1 (Ca:Sr:Eu=0:9:1)

$SrCO_3$, $SiO_2$, $Si_3N_4$, $Eu_2O_3$ and $CaCO_3$ as raw materials were mixed in weights of 15.998 g, 2.809 g, 9.704 g, 2.119 g and 0.000 g, respectively, and the obtained mixture was fed into a boron nitride crucible and baked under a reducing atmosphere using a hydrogen-nitrogen ($H_2$—$N_2$) mix gas at 1,500° C. for about 6 hours.

Example 2 (Ca:Sr:Eu=1:8:1)

$SrCO_3$, $SiO_2$, $Si_3N_4$, $Eu_2O_3$ and $CaCO_3$ as raw materials were mixed in weights of 14.497 g, 2.864 g, 9.251 g, 2.160 g and 1.229 g, respectively, and the obtained mixture was fed into a boron nitride crucible and baked under a reducing atmosphere using a hydrogen-nitrogen ($H_2$—$N_2$) mix gas at 1,500° C. for about 6 hours.

Example 3 (Ca:Sr:Eu=2:7:1)

$SrCO_3$, $SiO_2$, $Si_3N_4$, $Eu_2O_3$ and $CaCO_3$ as raw materials were mixed in weights of 12.936 g, 2.921 g, 9.434 g, 2.203 g and 2.506 g, respectively, and the obtained mixture was fed into a boron nitride crucible and baked under a reducing atmosphere using a hydrogen-nitrogen ($H_2$—$N_2$) mix gas at 1,500° C. for about 6 hours.

Example 4 (Ca:Sr:Eu=3:6:1)

$SrCO_3$, $SiO_2$, $Si_3N_4$, $Eu_2O_3$ and $CaCO_3$ as raw materials were mixed in weights of 11.313 g, 2.978 g, 9.625 g, 2.247 g and 3.835 g, respectively, and the obtained mixture was fed into a boron nitride crucible and baked under a reducing atmosphere using a hydrogen-nitrogen ($H_2$—$N_2$) mix gas at 1,500° C. for about 6 hours.

Example 5 (Ca:Sr:Eu=4:5:1)

$SrCO_3$, $SiO_2$, $Si_3N_4$, $Eu_2O_3$ and $CaCO_3$ as raw materials were mixed in weights of 9.936 g, 3.172 g, 9.927 g, 2.203 g and 5.147 g, respectively, and the obtained mixture was fed into a boron nitride crucible and baked under a reducing atmosphere using a hydrogen-nitrogen ($H_2$—$N_2$) mix gas at 1,500° C. for about 6 hours.

Example 6 (Ca:Sr:Eu=4:5.5:0.5)

$SrCO_3$, $SiO_2$, $Si_3N_4$, $Eu_2O_3$ and $CaCO_3$ as raw materials were mixed in weights of 10.449 g, 3.297 g, 9.970 g, 1.132 g and 5.152 g, respectively, and the obtained mixture was fed into a boron nitride crucible and baked under a reducing atmosphere using a hydrogen-nitrogen ($H_2$—$N_2$) mix gas at 1,500° C. for about 6 hours.

Example 7 (Ca:Sr:Eu=3.6:5:1.4)

$SrCO_3$, $SiO_2$, $Si_3N_4$, $Eu_2O_3$ and $CaCO_3$ as raw materials were mixed in weights of 9.328 g, 3.129 g, 9.876 g, 3.113 g and 4.554 g, respectively, and the obtained mixture was fed into a boron nitride crucible and baked under a reducing atmosphere using a hydrogen-nitrogen ($H_2$—$N_2$) mix gas at 1,500° C. for about 6 hours.

The following Table 1 shows lattice constants of phosphors formed in Examples 1 to 7 according to the present invention.

TABLE 1

| | Unit cell parameters | | | | | | |
|---|---|---|---|---|---|---|---|
| | a | b | c | α | β | γ | V |
| Example 1 | 7.2804 | 28.1561 | 7.1041 | 90.000 | 95.276 | 90.000 | 1450.06 |
| Example 2 | 7.2734 | 28.0592 | 7.0917 | 90.000 | 95.272 | 90.000 | 1441.18 |
| Example 3 | 7.2762 | 28.0653 | 7.0994 | 90.000 | 95.275 | 90.000 | 1443.63 |
| Example 4 | 7.2575 | 27.9148 | 7.0677 | 90.000 | 95.264 | 90.000 | 1425.81 |
| Example 5 | 7.2445 | 27.7452 | 7.0474 | 90.000 | 95.230 | 90.000 | 1410.62 |
| Example 6 | 7.2411 | 27.7993 | 7.0536 | 90.000 | 95.267 | 90.000 | 1413.82 |
| Example 7 | 7.2460 | 27.7629 | 7.0456 | 90.000 | 95.229 | 90.000 | 1411.47 |

In Table 1, a, b, and c are lattice constants, and α, β and γ are crystal angles and V is a unit cell volume.

Comparative Example 1 (Ca:Sr:Eu=0:9.5:0.5)

$SrCO_3$, $SiO_2$, $Si_3N_4$, $Eu_2O_3$ and $CaCO_3$ as raw materials were mixed in weights of 16.687 g, 3.048 g, 9.218 g, 1.047 g and 0.000 g, respectively, and the obtained mixture was fed into a boron nitride crucible and baked under a reducing atmosphere using a hydrogen-nitrogen ($H_2$—$N_2$) mix gas at 1,500° C. for about 6 hours.

FIG. 1 is a spectrum of x-ray diffraction patterns of Example 1 and Comparative Example 1 according to the present invention.

Figure 2:
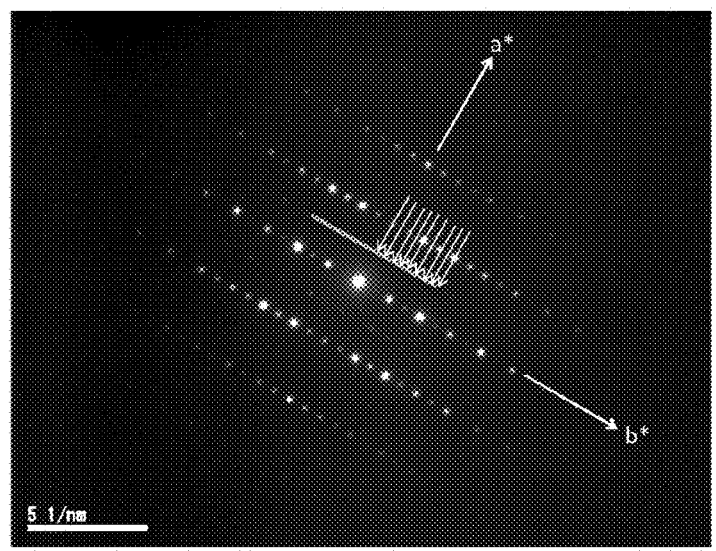
FIGS. 2 to 4 show TEM electron diffraction images of Example 1 according to the present invention.
Figure 3:
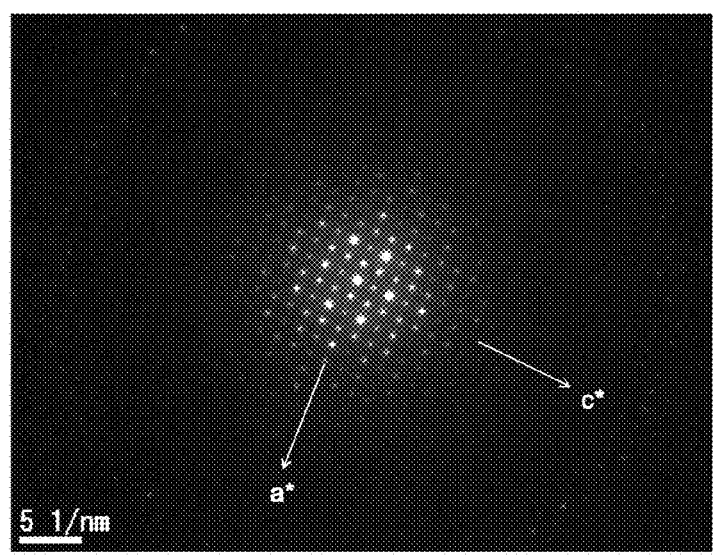
Figure 4:
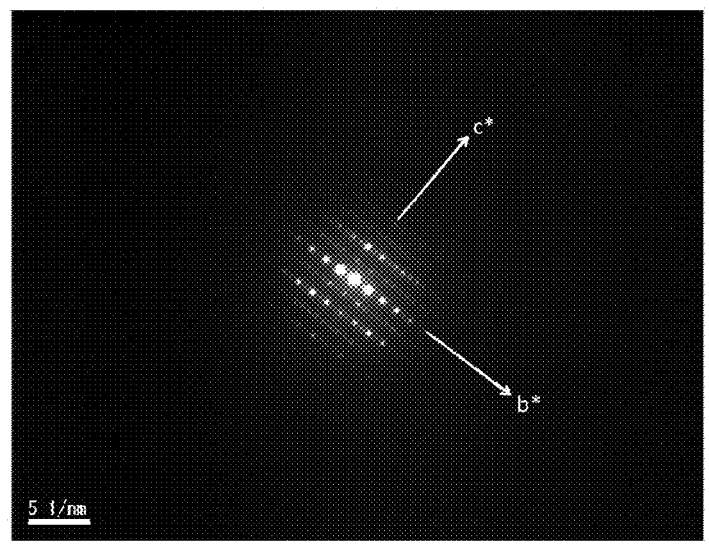

FIGS. 2 to 4 show TEM electron diffraction images of Example 1 according to the present invention.

Figure 5:
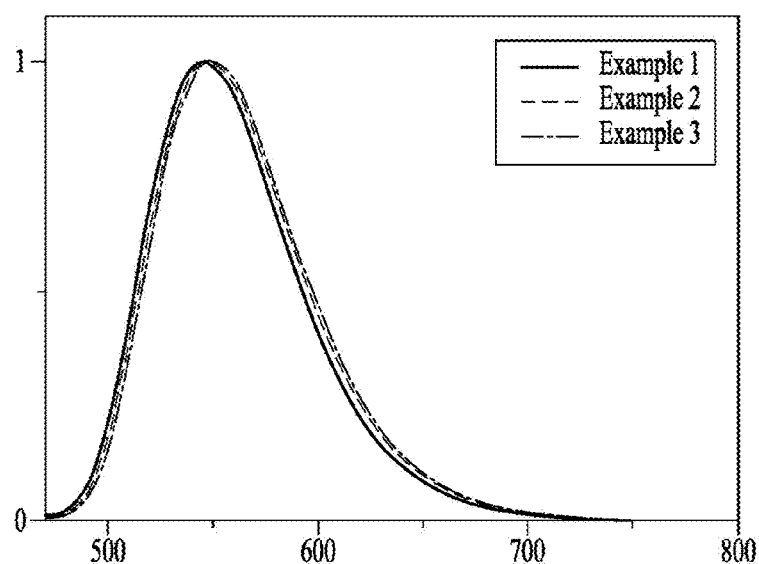
FIG. 5 shows emission spectra of Examples 1 to 3 according to the present invention.

FIG. 5 shows an emission spectrum of Examples 1 to 3 according to the present invention.

<Light Emitting Device>

Figure 6:
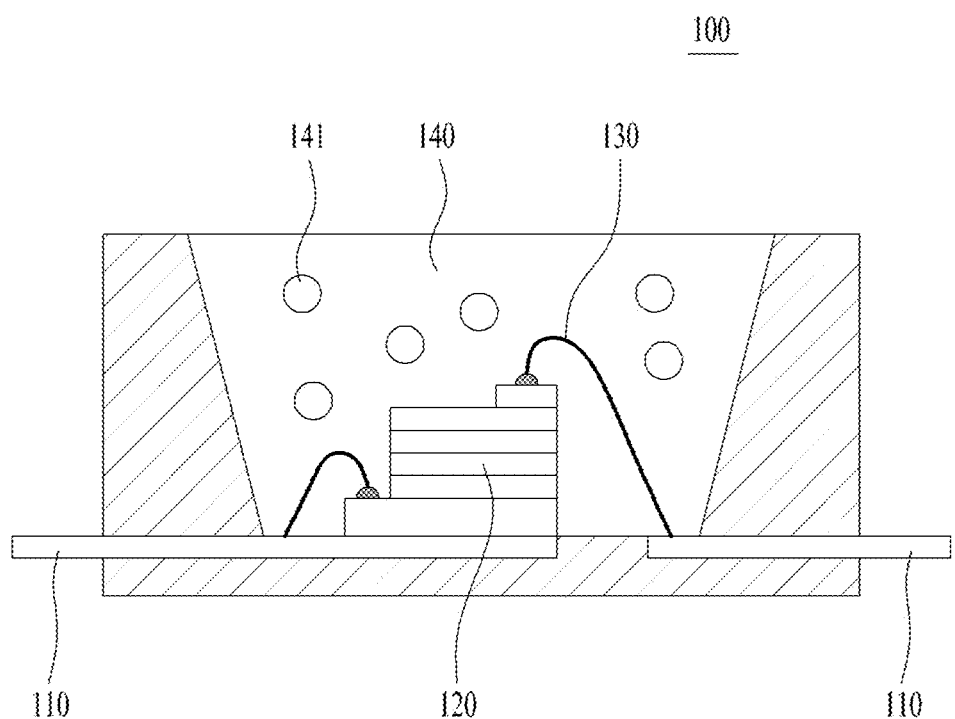
FIG. 6 is a sectional view illustrating a light emitting device package including the oxy-nitride phosphor according to an embodiment of the present invention.

FIG. 6 is a sectional view illustrating a light emitting device package including the oxy-nitride phosphor according to an embodiment of the present invention. FIG. 6 shows a surface-mounted light emitting device package.

As shown in FIG. 6, the surface-mounted light emitting device package 100 according to an embodiment of the present invention includes lead frames 110 of an anode and a cathode and a light emitting device 120 which is disposed on one of the lead frames 110 of the anode and the cathode, and emits light when a voltage is applied thereto. The light emitting device 120 may be a light emitting diode or a laser diode.

The light emitting device 120 is electrically connected to the lead frame 110 by a wire 130 and a light-transmitting resin 140 is molded on the light emitting device 120.

In addition, the light emitting device 120 includes a phosphor 141 dispersed in the light-transmitting resin 140.

The phosphor 141 used herein may include the aforementioned oxy-nitride phosphor as well as other phosphors dispersed therewith. For example, the phosphor 141 may be dispersed together with other phosphors such as YAG and β-SiAlON. In this case, the dispersed other phosphor may be used as a combination of two or more types.

The light emitting device 120 may be a near-ultraviolet or blue light emitting device which emits light having a main peak of emission spectrum in the wavelength range of 400 to 480 nm when a voltage is applied thereto.

In addition, a laser diode, surface-emitting laser diode, inorganic light emitting device, organic light emitting device or the like may be used, as a light emitting device, which has a main emission peak in the same wavelength range, instead of the near-ultraviolet light emitting device. In a preferred embodiment of the present invention, a nitride semiconductor light emitting diode is used.

A light-transmitting resin 140 used as a molding member may be a light-transmitting resin such as an epoxy resin, a silicone resin, a polyamide resin, a urea resin or an acrylic resin. Preferably, the light-transmitting resin 140 is a light-transmitting epoxy or silicone resin.

The light-transmitting resin 140 may be molded around the entirety of the light emitting device 120 and may be molded around a part of the light emitting device 120, if necessary. That is, a low capacity light emitting device is preferably entirely molded, whereas a high power light emitting device is preferably partially molded, because it may be difficult to uniformly disperse the phosphor 141 in the light-transmitting resin 140 due to large size of the light emitting device 120, if the high power light emitting device is entirely molded.

Figure 7:
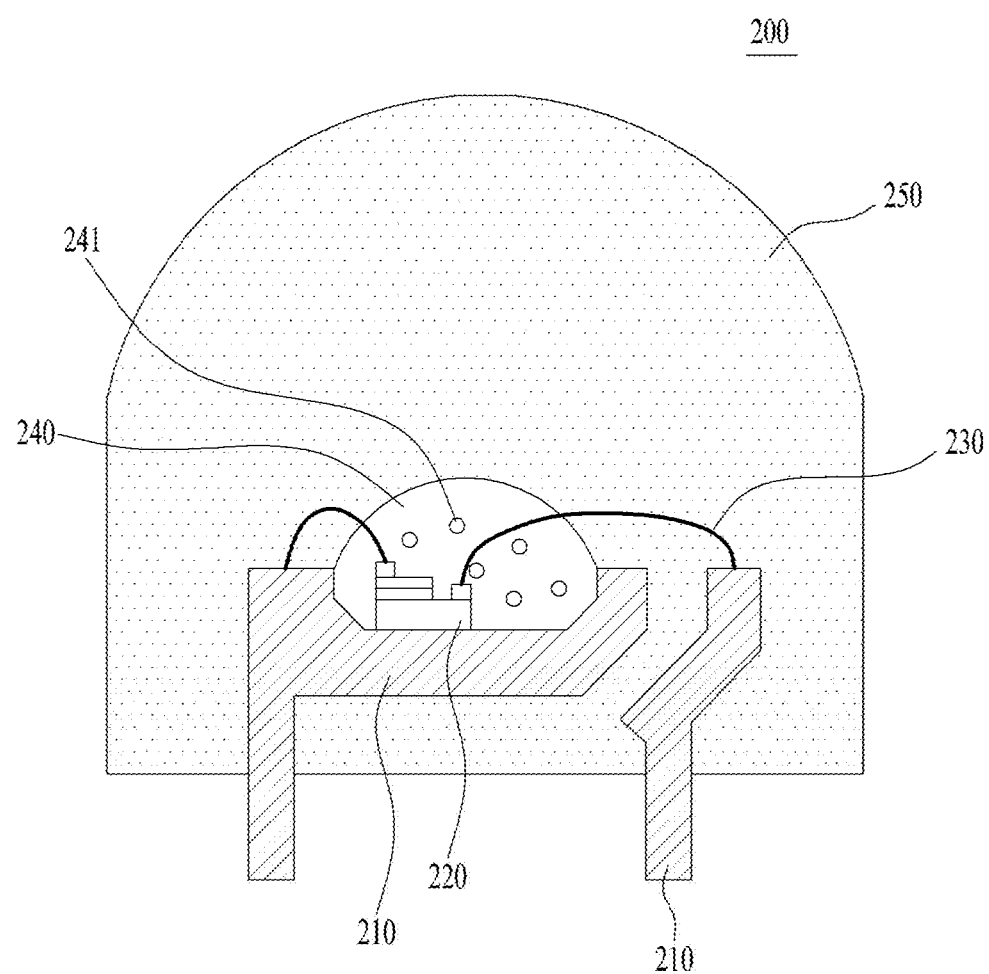
FIG. 7 is a sectional view illustrating a light emitting device package including the oxy-nitride phosphor according to another embodiment of the present invention.

FIG. 7 is a sectional view illustrating a light emitting device package including the oxy-nitride phosphor according to another embodiment of the present invention. FIG. 7 shows a lamp-type light emitting device package.

The lamp-type light emitting device package 200 includes a pair of lead frames 210 and a light emitting device 220 which emits light when a voltage is applied thereto.

The light emitting device 220 is electrically connected to the lead frame 210 by a wire 230 and a light-transmitting resin 240 is molded on the light emitting device 220.

The phosphor 241 may be dispersed in the light-transmitting resin 240 and an exterior material 250 for finishing the entire outer area of the device may be provided on the light-transmitting resin 240.

The phosphor 241 used herein may include the aforementioned oxy-nitride phosphor as well as other phosphors dispersed therewith. For example, the phosphor 241 may be dispersed together with other phosphors such as YAG and β-SiAlON. In this case, the dispersed other phosphor may be used as a combination of two or more types.

The light-transmitting resin 240 may be molded around the entirety of the light emitting device 220 and may be molded around a part of the light emitting device 120, if necessary. The reason has been described above.

The surface-mounted light emitting device package 100 or lamp-type light emitting device package 200 according to the present invention described in detail above may be realized by a white light emitting device package. A process of realizing white light will be described below.

Blue light having a wavelength range of 400 to 480 nm corresponding to near-ultraviolet light, which is emitted from the light emitting devices 120 and 220, passes through the phosphors 141 and 241. At this time, some light drives the phosphors 141 and 241 to generate light having a main peak having an emission wavelength center of 500 to 600 nm, whereas the remaining light passes therethrough while maintaining blue color.

As a result, white light having a spectrum of a wide wavelength of 400 to 700 nm is emitted.

The phosphors 141 and 241 may include the aforementioned oxy-nitride phosphor as well as other phosphors dispersed therewith.

For example, these phosphors 141 and 241 may be used as a mixture of the aforementioned oxy-nitride phosphor (hereinafter, referred to as a "first phosphor") and a second phosphor having an emission peak different from the first phosphor.

The light emitting device packages 100 and 200 may have an emission spectrum having one or more emission peaks in at least one of wavelength bands of 430 to 500 nm and 500 to 730 nm.

Meanwhile, although embodiments according to the present invention disclosed in the specification and the drawings have been provided as specific examples for illustrative purposes, they should not be construed as limiting the scope of the present invention. It will be apparent to those skilled in the art that various modifications and variations can be made in the present invention without departing from the spirit or scope of the invention.

INDUSTRIAL APPLICABILITY

According to the present invention, it is possible to obtain an oxy-nitride phosphor which is a phosphor having high brightness and luminous efficiency, and to realize a light emitting device package with high luminous efficiency including the same.

The invention claimed is:

1. An oxy-nitride phosphor represented by the following Formula 1 and having a monoclinic crystal structure, $$(Sr,Ca)_{1-y}Si_2N_2O_2:Eu_y, \quad \text{<Formula 1>}$$

wherein the crystal structure has a unit cell volume in a range of 1411 to 1450 Å$^3$, and wherein the phosphor has lattice constants 'a' in a range of 7.2411 to 7.2804 Å, 'b' in a range of 27.7452 to 28.1561 Å and 'c' in a range of 7.0456 to 7.1041 Å in the monoclinic crystal structure.

2. The oxy-nitride phosphor according to claim 1, wherein the phosphor has a peak emission wavelength of 530 nm to 580 nm.

3. The oxy-nitride phosphor according to claim 1, wherein a content y of the activator is not less than 0.001 and not more than 0.15.

4. A method of producing an oxy-nitride phosphor comprising forming, using starting materials, an oxy-nitride phosphor represented by the following Formula 1 and having a monoclinic crystal structure:

$$(Sr,Ca)_{1-y}Si_2N_2O_2:Eu_y, \quad \text{<Formula 1>}$$

wherein the crystal structure has a unit cell volume in a range of 1411 to 1450 Å$^3$, and wherein at least one of SrF$_2$, BaF, H$_3$BO$_4$ or NaCl is used as a flux for formation of the phosphor.

5. The method according to claim 4, wherein the starting materials comprise at least one of carbonate of an alkali earth metal, silicon oxide, silicon nitride, europium oxide, Ca, Sr, Si and Eu, oxides thereof and nitrides thereof.

6. The method according to claim 4, wherein the formation of the phosphor is carried out by baking at a temperature of 1,400 to 1,700° C. under a reducing atmosphere or an inert atmosphere.

7. The method according to claim 4, wherein the phosphor has a peak emission wavelength of 530 nm to 580 nm.

8. The method according to claim 4, wherein a content y of the activator is not less than 0.001 and not more than 0.15.

9. A light emitting device package comprising:
a first phosphor represented by Formula 1 according to claim 1; and
a light emitting device for emitting excitation light to excite the first phosphor.

10. The light emitting device package according to claim 9, further comprising a second phosphor having a peak wavelength of the excitation light and an emission peak different from a peak wavelength of the first phosphor.

11. The light emitting device package according to claim 10, wherein the light emitting device package has an emission spectrum having one or more emission peaks in at least one of wavelength bands of 430 to 500 nm and 500 to 730 nm.

12. The light emitting device package according to claim 9, wherein a light transmitting resin is disposed on the light emitting device and the first phosphor is present in the light transmitting resin.

13. The method according to claim 4, wherein the phosphor has lattice constants 'a' in a range of 7.2411 to 7.2804 Å, 'b' in a range of 27.7452 to 28.1561 Å and 'c' in a range of 7.0456 to 7.1041 Å in the monoclinic crystal structure.

* * * * *